(12) United States Patent
Hsu et al.

(10) Patent No.: US 10,985,028 B1
(45) Date of Patent: Apr. 20, 2021

(54) SEMICONDUCTOR DEVICES AND METHODS OF MANUFACTURING

(71) Applicant: Taiwan Semiconductor Manufacturing Company, Ltd., Hsinchu (TW)

(72) Inventors: Wan Hsuan Hsu, Taoyuan (TW); Jao Sheng Huang, Jiayi (TW); Yen-Chiu Kuo, Tainan (TW); Yu-Li Cheng, Tainan (TW); Ya Tzu Chen, Tainan (TW); Neng-Jye Yang, Hsinchu (TW); Chun-Li Chou, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/657,269

(22) Filed: Oct. 18, 2019

(51) Int. Cl.
| | |
|---|---|
| *H01L 21/31* | (2006.01) |
| *H01L 21/02* | (2006.01) |
| *H01L 21/311* | (2006.01) |
| *H01L 21/67* | (2006.01) |
| *H01L 21/687* | (2006.01) |

(52) U.S. Cl.
CPC .... *H01L 21/31111* (2013.01); *H01L 21/0206* (2013.01); *H01L 21/02178* (2013.01); *H01L 21/02186* (2013.01); *H01L 21/31144* (2013.01); *H01L 21/6708* (2013.01); *H01L 21/68764* (2013.01)

(58) Field of Classification Search
CPC ......... H01L 21/31111; H01L 21/68764; H01L 21/31144; H01L 21/02178; H01L 21/02186; H01L 21/6708; H01L 21/0206

USPC .......................................... 257/623, 368, 618
See application file for complete search history.

(56) References Cited

U.S. PATENT DOCUMENTS

| | | | | |
|---|---|---|---|---|
| 2010/0068874 A1* | 3/2010 | Chang | ............... | H01L 21/31133 438/584 |
| 2011/0006378 A1* | 1/2011 | Hussain | ............ | H01L 21/31111 257/392 |
| 2011/0201203 A1* | 8/2011 | Lee | .................... | H01L 21/32134 438/700 |
| 2012/0282764 A1* | 11/2012 | Hempel | ............ | H01L 21/76825 438/585 |
| 2013/0323930 A1* | 12/2013 | Chattopadhyay | .......................... | H01L 21/76829 438/703 |
| 2014/0154861 A1* | 6/2014 | Pellizzer | ........... | H01L 21/02115 438/382 |
| 2015/0118850 A1* | 4/2015 | Peng | ................. | H01L 21/31116 438/703 |
| 2015/0132965 A1* | 5/2015 | deVilliers | ......... | H01L 21/31111 438/703 |
| 2015/0325453 A1* | 11/2015 | Lu | ..................... | H01L 21/31144 438/703 |

(Continued)

*Primary Examiner* — Sheikh Maruf
(74) *Attorney, Agent, or Firm* — Slater Matsil, LLP

(57) ABSTRACT

An apparatus, semiconductor device and method of manufacture are presented, wherein a hard mask layer and one or more etch stop layers are etched in an etching chamber. In an embodiment the semiconductor device is placed on a mounting platform at a first height and an etch process is performed, then the semiconductor device is moved to a second height within the chamber and a second etch process is performed, with the rotational speed of the semiconductor device reduced during movements in order to reduce the chance of cross contamination.

20 Claims, 12 Drawing Sheets

(56) References Cited

U.S. PATENT DOCUMENTS

| | | | |
|---|---|---|---|
| 2016/0043001 A1* | 2/2016 | Kim | H01L 21/82343 |
| | | | 438/703 |
| 2016/0086815 A1* | 3/2016 | Pandit | H01L 21/32136 |
| | | | 438/703 |
| 2016/0155626 A1* | 6/2016 | Chang | H01L 21/02343 |
| | | | 438/283 |
| 2016/0181090 A1* | 6/2016 | Sanchez | H01L 29/0657 |
| | | | 257/618 |

* cited by examiner

SEMICONDUCTOR DEVICES AND METHODS OF MANUFACTURING

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
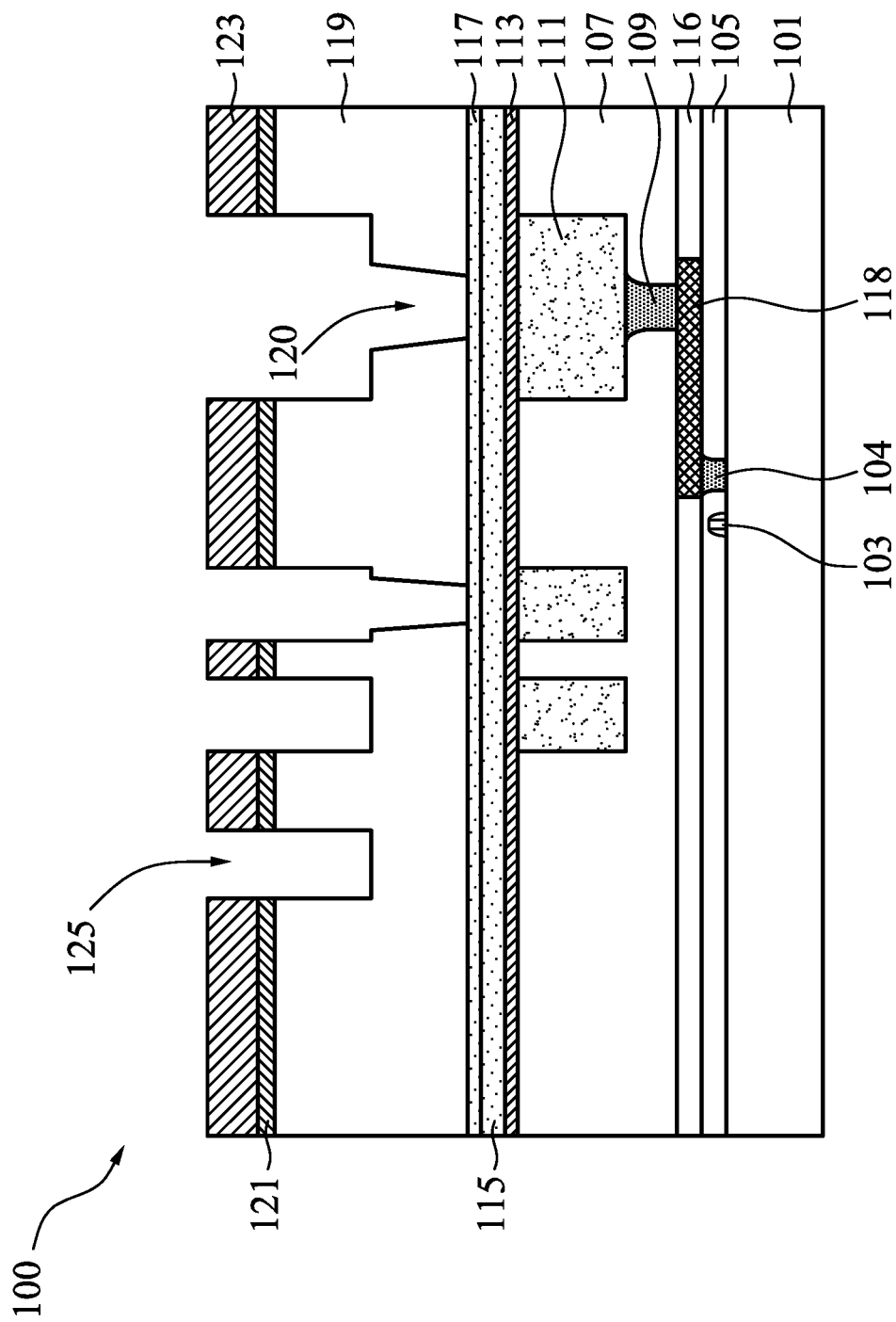
FIG. 1 illustrates a patterning of a dielectric layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a one step etching process for hardmasks and etch stop layer removal in a back end of line process of a 5 nm process node. However, the embodiments described herein may be used in a wide variety of applications, and the discussions should not be interpreted as limiting the embodiments.

With reference now to FIG. 1, FIG. 1 illustrates an intermediate manufacture of a semiconductor device 100, wherein the semiconductor device 100 comprises a semiconductor substrate 101, active devices 103 within an active region (or oxide definition (OD) region) of the semiconductor substrate 101, an interlayer dielectric layer 105 over the active devices 103, contact plugs 104, a first dielectric layer 116, a contact plug trench 118, a second dielectric layer 107, and a first via 109 and a first trench 111 located within the second dielectric layer 107. In an embodiment the semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active devices 103. As one of ordinary skill in the art will recognize, a wide variety of active devices and passive devices such as transistors, capacitors, resistors, combinations of these, and the like may be used to generate the desired structural and functional requirements of the design for the semiconductor device 100. The active devices 103 may be formed using any suitable methods.

The interlayer dielectric layer 105 is formed over the active devices 103 in order to protect and isolate the active devices 103. In an embodiment the interlayer dielectric layer 105 may comprise a material such as boron phosphorous silicate glass (BPSG), although any suitable dielectrics may be used for either layer. The interlayer dielectric layer 105 may be formed using a process such as PECVD, although other processes, such as LPCVD, may also be used. The interlayer dielectric layer 105 may be formed to a thickness of between about 100 Å and about 3,000 Å.

Once the interlayer dielectric layer 105 has been formed, contact plugs 104 may be formed through the interlayer dielectric layer 105 to electrically connect the active devices 103 with the overlying structures. In an embodiment the formation of the contact plugs 104 may be initiated by first forming contact plug openings through the interlayer dielectric layer to expose a conductive portion of the active devices 103. In an embodiment the contact plug openings may be formed using a suitable photolithographic masking and etching process.

Once the contact plug openings have been formed, a formation of a first glue layer (not separately illustrated in FIG. 1) may be initiated. In an embodiment the first glue layer is utilized to help adhere the rest of the contact plugs 104 to the underlying structure and may be, e.g., tungsten, titanium nitride, tantalum nitride, or the like formed using a process such as CVD, plasma enhanced chemical vapor deposition (PECVD), physical vapor deposition (PVD), atomic layer deposition (ALD), and the like or the like.

Once the first glue layer has been formed, the remainder of the contact plugs 104 is formed in contact with the glue layer. In an embodiment the material of the contact plugs 104 is tungsten (W), although any other suitable material, such as aluminum, copper, combinations of these, or the like, may be utilized. The material of the contact plugs 104 may be formed using a process such as CVD, although any suitable process, such as PECVD, physical vapor deposition (PVD), atomic layer deposition (ALD), and the like, may be utilized.

Once filled, a planarization of the contact plugs 104 is performed such that the material of the contact plugs 104 that is outside of the interlayer dielectric layer 105 is removed, forming the contact plugs 104 (one of which is illustrated in FIG. 1). In an embodiment the planarization process is a chemical mechanical polish (CMP), in which a combination of etching materials and abrading materials are put into contact with the material of the contact plugs 104 and a grinding pad (not separately illustrated) is used to grind away the material of the contact plugs 104 until all of the material of the contact plugs 104 over the interlayer dielectric layer 105 has been removed.

The first dielectric layer 116 may be formed over the interlayer dielectric layer 105. The first dielectric layer 116 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 116 may be formed through a process such as a spin-on process or a chemical vapor deposition (CVD), although any suitable process may be utilized, and may have a thickness of between about 400 Å and about 1000 Å, such as about 600 Å.

Once the first dielectric layer 116 has been formed, a contact plug trench 118 may be formed to connect the contact plugs 104 to overlying metallization layers and, in some embodiments, each other. In an embodiment the contact plug trench 118 may be formed using a damascene process, whereby an opening is formed within the first dielectric layer 116 to expose the contact plugs 104, and the opening is then filled with a conductive material. In another embodiment, the contact plug trench 118 and the contact plugs 104 may be formed simultaneously using, e.g., a dual damascene process. Any suitable method of manufacturing the contact plugs 104 and the contact plug trench 118 may be utilized.

The second dielectric layer 107 may be formed over the first dielectric layer 116. The second dielectric layer 107 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The second dielectric layer 107 may be formed through a process such as a spin-on process or a chemical vapor deposition (CVD), although any suitable process may be utilized, and may have a thickness of between about 400 Å and about 1000 Å, such as about 600 Å.

FIG. 1 additionally illustrates a formation of a first via 109 and a first trench 111 within the second dielectric layer 107. In an embodiment the first via 109 and the first trench 111 may be formed using, e.g., a dual damascene process, whereby an opening for both the first via 109 and the first trench 111 is first formed within the second dielectric layer 107. In an embodiment the opening may be formed by placing and patterning a photoresist material over the second dielectric layer 107. Once the photoresist material has been placed and patterned, a dry etch process such as a reactive ion etch may be utilized to transfer the pattern from the patterned photoresist to the underlying second dielectric layer 107. This process may be repeated to form both the via portion of the opening and the trench portion of the opening.

Once the opening has been formed, the opening may be filled with a conductive material in order to form the first via 109 and the first trench 111 within the second dielectric layer 107. In an embodiment the formation of the conductive material may be initiated by first depositing a barrier layer (not separately illustrated in FIG. 1). The barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer.

Once the barrier layer has been formed, a conductive material may be deposited to fill and/or overfill the openings within the second dielectric layer 107. In an embodiment the conductive material may be a material such as copper, tungsten, ruthenium, titanium dioxide, combinations of these, or the like, formed, e.g., using a seed layer (not shown) and a plating process, such as electrochemical plating, although other processes of formation, such as sputtering, evaporation, or a PECVD process, may also be used depending upon the desired materials. Once the openings have been filled with conductive material, any excess conductive material outside of the openings may be removed, and the first trench 111 and the second dielectric layer 107 may be planarized using, for example, a chemical mechanical polishing process.

FIG. 1 also illustrates the beginning process for the formation of another metallization layer (over the metallization layer formed by the first via 109 and the first trench 111). In an embodiment a first etch stop layer 113, a second etch stop layer 115, a third etch stop layer 117, and a third dielectric layer 119 are formed over the second dielectric layer 107.

The first etch stop layer 113 is used to protect the underlying structures and provide a control point for a subsequent etching process through, e.g., the second etch stop layer 115. In one embodiment, the first etch stop layer 113 may be formed of aluminum nitride (AlN) using plasma enhanced chemical vapor deposition (PECVD), although other materials such as nitrides, carbides, borides, combinations thereof, or the like, and techniques of forming the first etch stop layer 113, such as low pressure CVD (LPCVD), PVD, or the like, could be used. The first etch stop layer 113 may have a thickness of between about 50 Å and about 2,000 Å, such as about 200 Å.

Once the first etch stop layer 113 has been formed to cover the second dielectric layer 107, the second etch stop layer 115 is formed over the first etch stop layer 113. In an embodiment the second etch stop layer 115 is formed of a material such as a carbon doped oxide such as SiOC, although any other suitable material may also be used. The material of the second etch stop layer 115 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the second etch stop layer 115 has been formed, the third etch stop layer 117 is formed over the second etch stop layer 115. In an embodiment the third etch stop layer 117 is formed of a material such as aluminum oxide, although any suitable material, such as aluminum nitride, may also be used. The material of the third etch stop layer 117 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the third etch stop layer 117 has been formed, the third dielectric layer 119 may be formed. In an embodiment the third dielectric layer 119 may be, e.g., a low-k dielectric film intended to help isolate interconnects from other structures. By isolating the interconnects, the resistance-capacitance (RC) delay of the interconnects may be reduced, thereby improving the overall efficiency and speed of electricity through the interconnect.

In an embodiment the third dielectric layer 119 may be a porous material such as SiOCN, SiCN or SiOC and may be formed by initially forming a precursor layer over the third etch stop layer 117. The precursor layer may comprise both a matrix material and a porogen interspersed within the matrix material, or may also comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the third etch stop layer 117, may also be utilized.

The precursor layer may be formed to a thickness sufficient to provide the isolation and routing characteristics that are desired of the third dielectric layer 119. In an embodiment, the precursor layer may be formed to a thickness of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may also be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may be utilized. However, as one of ordinary skill in the art will recognize, the materials and processes listed herein are merely illustrative and are not meant to be limiting to the embodiments, as any other suitable matrix precursors may be utilized.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the third dielectric layer 119. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the third dielectric layer 119. Other suitable processes, such as irradiating the porogen with UV radiation to decompose the porogen or utilizing microwaves to decompose the porogen, may also be utilized. These and any other suitable process to remove all or a portion of the porogen are all fully intended to be included within the scope of the embodiments.

FIG. 1 additionally illustrates a placement of an anti-reflective layer 121. In an embodiment the anti-reflective layer 121 may be a nitrogen-free anti-reflective coating. In such an embodiment, the anti-reflective layer 121 may be applied to the third dielectric layer 119 so that the material for the anti-reflective layer 121 coats an upper exposed surface of the third dielectric layer 119, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 121 may be applied such that it has a thickness of between about 50 nm and about 500 nm, such as about 300 nm.

Once the anti-reflective layer 121 has been formed, a first hardmask 123 may be formed over the anti-reflective layer 121. In an embodiment the first hardmask 123 may be a masking material such as titanium nitride (TiN), although any other suitable material, such as titanium oxide or a titanium rich material, may be used. The first hardmask 123 may be formed using a deposition process such as chemical vapor deposition, physical vapor deposition, atomic layer deposition, combinations of these, or the like, and may be formed to a thickness of between about 50 Å and about 800 Å, such as about 300 Å. However, any suitable thickness may be utilized.

Once formed, the first hardmask 123 may be patterned in order to provide a masking layer for a subsequent etching process to form a via opening 120. In an embodiment the first hardmask 123 may be patterned by placing a first photoresist over the first hardmask 123 and then exposing and developing the first photoresist to form a patterned photoresist. In an embodiment the first photoresist is a tri-layer photoresist, with a bottom anti-reflective coating (BARC) layer, an intermediate mask layer, and a top photoresist layer. However, any suitable type of photosensitive material or combination of materials may be utilized. Once the first photoresist has been patterned, the pattern of the first photoresist is then transferred to the first hardmask 123 using, e.g., an anisotropic etching process such as a reactive ion etching process. However, any suitable process may be utilized.

Once the first hardmask 123 has been patterned, the pattern of the first hardmask 123 may be transferred to the third dielectric layer 119 using a first etching process. In an embodiment the first etching process may be, e.g., an anisotropic etching process such as a reactive ion etch with etchants suitable to etch the third dielectric layer 119. However, any suitable etching method or combination of etching methods may be utilized.

By using the first etch process and the first hardmask 123, the pattern of the first hardmask 123 is transferred to the anti-reflective layer 121 and then to the third dielectric layer 119 and the via opening 120 is formed. In an embodiment the transfer of the pattern from the first hardmask 123 into the third dielectric layer 119 helps to form a via portion of an interconnect 901 (not illustrated in FIG. 1 but illustrated and discussed further below with respect to FIG. 9) into the third dielectric layer 119. In a particular embodiment, the via portion of the interconnect 901 may be formed by the first etch process to extend into the third dielectric layer 119, but not through the third dielectric layer 119.

Once the via opening 120 has been formed, the first photoresist is removed. In an embodiment the first photoresist is removed using a process such as ashing, whereby the temperature of the first photoresist is increased until the first photoresist experiences a thermal decomposition, at which point the first photoresist may be easily removed. However, any other suitable process, such as a wet or dry etch, or even removing the first photoresist using the same etching process that forms the via opening 120, may be used.

Once the first photoresist has been removed, a second photoresist (not separately illustrated) may be deposited and patterned to form openings to assist in the patterning of trench openings 125. In an embodiment the second photoresist is a tri-layer photoresist, with a bottom anti-reflective coating (BARC) layer, an intermediate mask layer, and a top photoresist layer. However, any suitable type of photosensitive material or combination of materials may be utilized.

Once the second photoresist has been placed over the first hardmask 123 and the via opening 120, the second photoresist is patterned. In an embodiment the second photoresist may be patterned by exposing a photosensitive material within the second photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photoresist are different from the physical properties of the unexposed portions of the second photoresist. The second photoresist may then be developed with, e.g., a developer (not separately illustrated), in order to separate the exposed portion of the second photoresist from the unexposed portion of the second photoresist, and the pattern of the top photoresist layer may be extended through the intermediate mask layer and the bottom anti-reflective coating layer.

Once the second photoresist has been placed and patterned, a second etching process may be used to form trench openings 125. In an embodiment the second etching process may be similar to the first etching process. For example, the second etching process may be an anisotropic etching process such as a reactive ion etching process that utilizes etchants that are selective to the third dielectric layer 119.

The second etching process will work to form the trench openings 125 and also to extend the via opening 120 all of the way through the third dielectric layer 119 and will expose the underlying third etch stop layer 117, which material is chosen to stop or at least slow down the second etching process and prevent the second etching process from etching past the third etch stop layer 117. As such, the via openings 120 may extend into, but not through, the third etch stop layer 117.

Figure 2A:
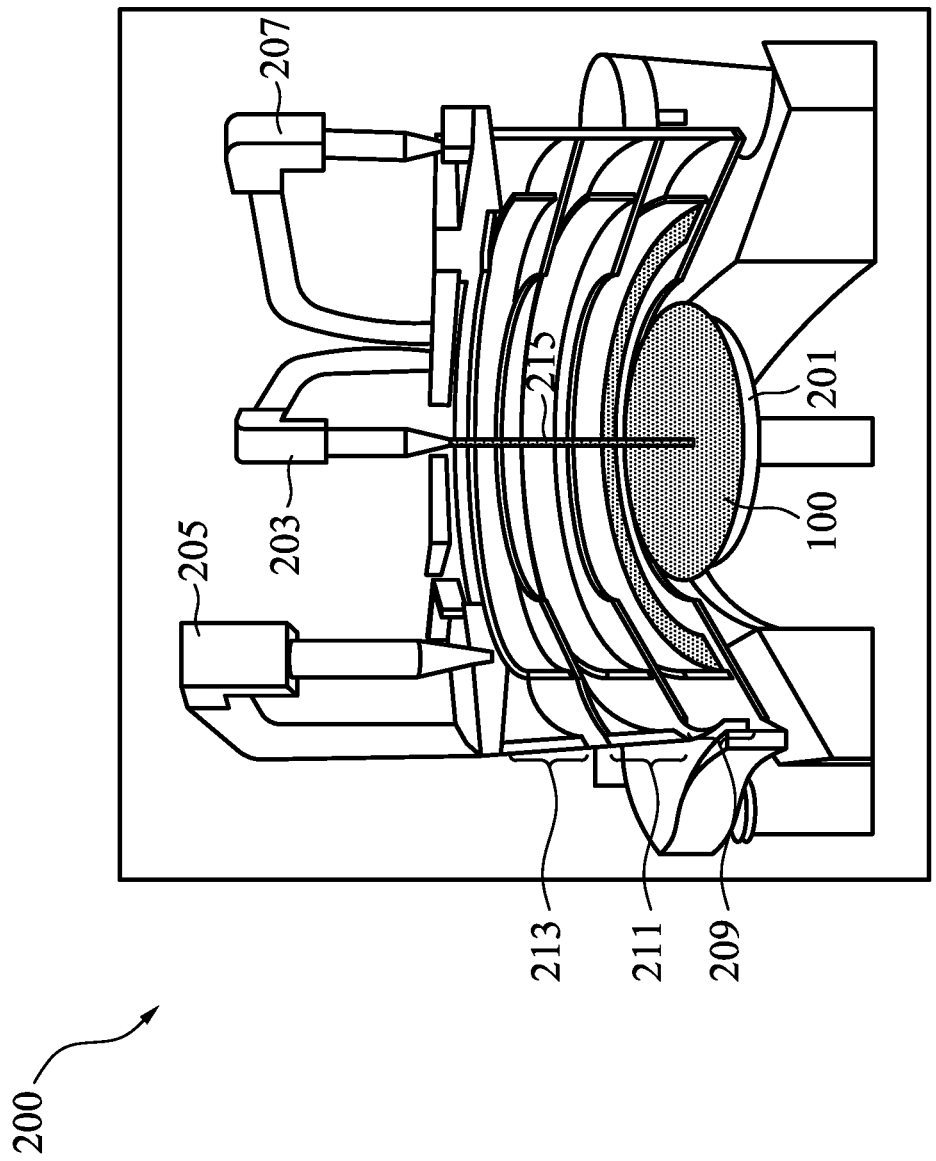
FIGS. 2A-2C illustrate a first dispersal process, in accordance with some embodiments.
Figure 2B:
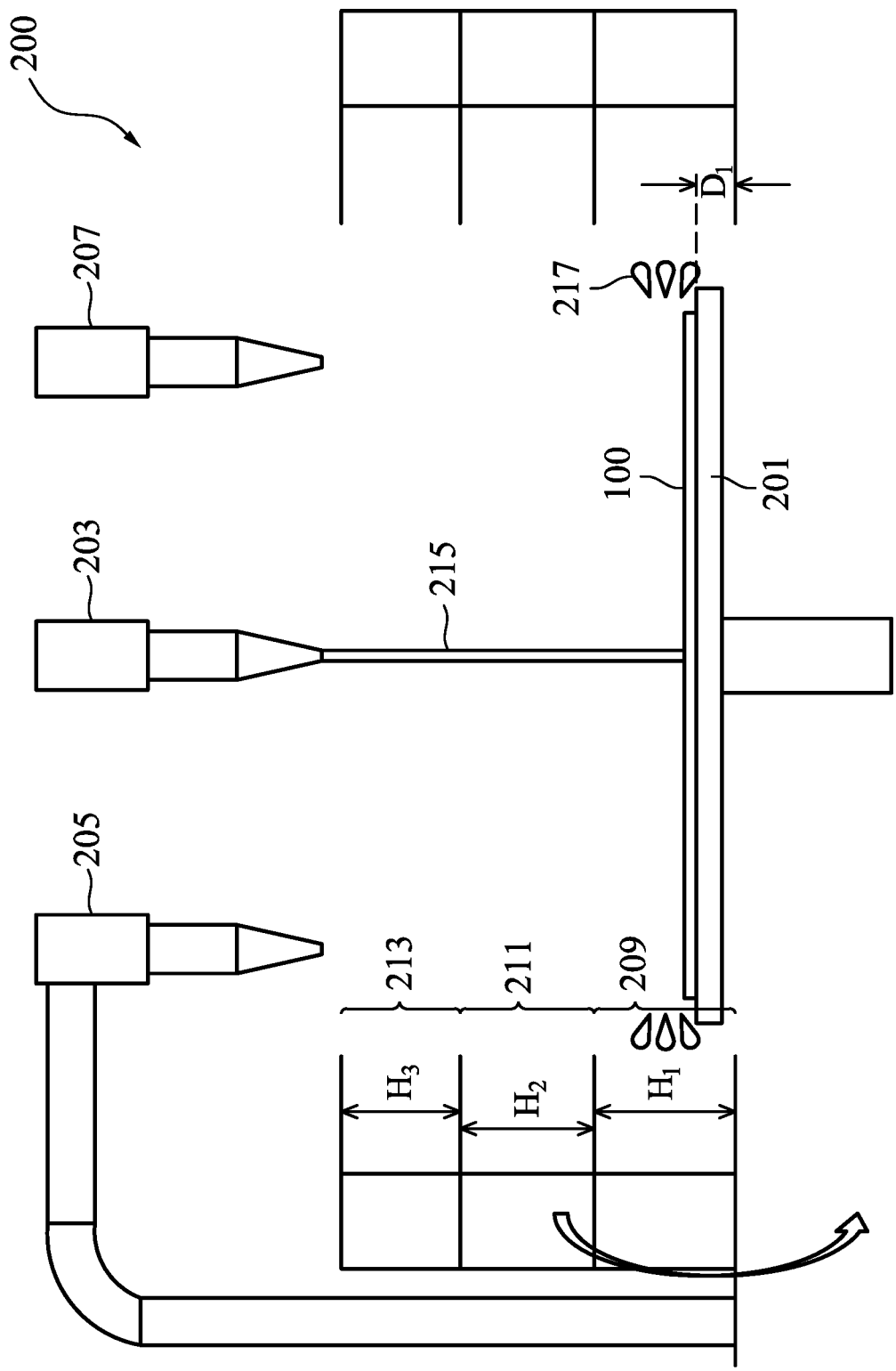

FIGS. 2A-2B illustrate an apparatus 200 or chamber that may be utilized in order to both remove the first hardmask 123 as well as break through the third etch stop layer 117, the second etch stop layer 115, and/or the first etch stop layer 113, with FIG. 2B being a cross-sectional view relative to FIG. 2A's isometric view. In an embodiment the apparatus 200 comprises a mounting platform 201, a first liquid dispenser 203, a second liquid dispenser 205, and a third liquid dispenser 207.

Within the apparatus 200, the semiconductor device 100 may be placed on the mounting platform 201 in order to position and control the semiconductor device 100 during the removal processes. In an embodiment the mounting platform 201 will not only hold the semiconductor device 100, but also comprises one or more motors to both spin the semiconductor device 100 during the removal processes and also to modify the position of the semiconductor device 100 with respect to a first tier 209, a second tier 211, and a third tier 213. In other words, the mounting platform 201 both spins the semiconductor device 100 and also moves the semiconductor device 100 up and down in FIG. 2B.

The first liquid dispenser 203 is utilized to dispense a first liquid etchant 215 onto the semiconductor device 100 during a first dispensing process (discussed further below). In an embodiment the first liquid dispenser 203 is movable with respect to the mounting platform 201 and with respect to the second liquid dispenser 205 and the third liquid dispenser 207, so that, when not in use, the first liquid dispenser 203 may be rotated and moved out of the way so that the first liquid dispenser 203 does not interfere or possibly contaminate the semiconductor device 100 during other steps of the removal process.

The second liquid dispenser 205 and the third liquid dispenser 207 may be similar to the first liquid dispenser 203, such as by being a dispenser that is movable with respect to the mounting platform 201 and each other. However, the second liquid dispenser 205 and the third liquid dispenser 207 are dedicated to dispensing different liquids (discussed further below) than either the first liquid dispenser 203 or each other. However, in other embodiments the second liquid dispenser 205 and the third liquid dispenser 207 may be different from the first liquid dispenser 203.

In an embodiment, each one of the first liquid dispenser 203, the second liquid dispenser 205, and the third liquid dispenser 207 may be utilized to dispense a single liquid that is used in the removal process. For example, the first liquid dispenser 203 may be utilized to dispense a first liquid etchant 215 (discussed further below), the second liquid dispenser 205 may be utilized to dispense a first rinse liquid 401, and the third liquid dispenser 207 may be utilized to dispense a second liquid etchant 601. However, while three dispensers for three different liquids are described, the embodiments are not so limited, as any suitable number of dispensers and any suitable number of process liquids may be utilized.

The first tier 209, the second tier 211, and the third tier 213 are positioned in order to help collect and return the process liquids that are utilized within the removal processes. For example, the first tier 209 is positioned to collect and return the first liquid etchant 215 that is dispensed from the first liquid dispenser 203, the second tier 211 is positioned to collect the first rinse liquid 401 that is dispensed from the second liquid dispenser 205, and the third tier 213 is positioned to collect the second liquid etchant 601 that is dispensed from the third liquid dispenser 207. In a particular embodiment in which the mounting platform 201 can move the semiconductor device 100 up and down, the first tier 209, the second tier 211 and the third tier 213 may be stacked on top of each other in order to be positioned to collect the various liquids at different points of the removal process.

In a particular embodiment, the first tier 209 has a first height $H_1$ that is sufficient to capture most, if not all, of the first liquid etchant 215 as the first liquid etchant 215 is dispensed and removed from the semiconductor device 100. As such, the first height $H_1$ may be between about 30 mm and about 40 mm, such as about 30 mm. However, any suitable first height $H_1$ may be used.

Similarly, the second tier 211 has a second height $H_2$ that is sufficient to capture most, if not all, of the first rinse liquid 401 as the first rinse liquid 401 is dispensed and removed from the semiconductor device 100. As such, the second height $H_2$ may be between about 30 mm and about 40 mm, such as about 30 mm. However, any suitable second height $H_2$ may be used.

Finally, the third tier 213 has a third height $H_3$ that is sufficient to capture most, if not all, of the second liquid etchant 601 as the second liquid etchant 601 is dispensed and removed from the semiconductor device 100. As such, the third height $H_3$ may be between about 30 mm and about 40 mm, such as about 30 mm. However, any suitable third height $H_3$ may be used.

FIG. 2B also illustrates a first dispensing process of the removal process to remove both the first hardmask 123 as well as one or more of the third etch stop layer 117, the second etch stop layer 115, and/or the first etch stop layer 113 in the same apparatus. In an embodiment the removal process may be initiated by placing and attaching the semiconductor device 100 to the mounting platform 201. Additionally, at the first step the mounting platform 201 is positioned such that the first liquid etchant 215, after being dispensed onto the semiconductor device 100, will be received by the first tier 209. For example, a top surface of the mounting platform 201 (e.g., the surface to which the semiconductor device 100 is attached), may be positioned to be located a first distance $D_1$ above a bottom surface of the first tier 209, with the first distance $D_1$ being between about less than 10 mm and about 15 mm, such as about 12 mm. However, any suitable first distance $D_1$ may be utilized.

Once the mounting platform 201 has been positioned and the semiconductor device 100 has been attached, the first liquid dispenser 203 may be rotated into position while the second liquid dispenser 205 and the third liquid dispenser 207 may be rotated or otherwise positioned to prevent interference. In an embodiment the first liquid dispenser 203 may be positioned over the location of the semiconductor device 100 such that the first liquid etchant 215 is dispensed from a position directly over the semiconductor device 100. However, any suitable position of the first liquid dispenser 203 to dispense the first liquid etchant 215 may be utilized.

Once the semiconductor device 100 has been attached to the mounting platform 201, and the mounting platform 201 and the first liquid dispenser 203 have been positioned, the mounting platform 201 may begin rotating the semiconductor device 100 in preparation for receiving the first liquid etchant 215. In an embodiment the mounting platform 201 may rotate the semiconductor device 100 at a first dispersal rotation speed of between about 1 rpm and about 2000 rpm, such as about 300 rpm. However, any suitable dispersal rotation speed may be utilized.

Once the semiconductor device 100 is rotating at the first dispersal rotation speed, the first liquid dispenser 203 may begin a first dispensing process by dispensing the first liquid etchant 215 onto the semiconductor device 100. In an embodiment the first liquid etchant 215 is an etchant that is selective to the material of the first hardmask 123 (e.g., TiN). In some particular embodiments, the first liquid etchant 215 may comprise both a first etching solvent and a first etching agent.

The first etching agent may be an agent which helps to selectively remove the materials of the first hardmask 123. As such, while the precise agent depends at least in part on the materials chosen for the first hardmask 123, in an embodiment the first etching agent may be an oxidizing agent such as hydrogen peroxide ($H_2O_2$), 1,2,3-Benzotriazole, or 1-dioxide, combinations of these or the like.

The first etching solvent may be utilized to help mix and deliver the first etching agent without necessarily participating in the etching reaction itself. In a particular embodiment the first etching solvent may be a solvent such as deionized water, an alkalinity solvent, or a chelating agent. However, any suitable solvent may be utilized.

To prepare the first liquid etchant 215 for usage, the first etching agent may be placed within the first etching solvent. In an embodiment the first etching agent may be placed within the first etching solvent to have a concentration of between about 10%-weight and about 50%-weight and may be hydrogen peroxide ($H_2O_2$). However, any suitable concentration may be utilized.

In an embodiment the first liquid etchant 215 may be dispensed from the first liquid dispenser 203 at a rate of between about 1000 mL/min and about 1500 mL/min. Additionally, the first liquid etchant 215 may be dispensed at a temperature of greater than about 55° C. to about 60° C. and may be dispensed for a time of between about 15 s and about 240 s, such as about 120 s. However, any suitable process conditions may be utilized during the dispensing of the first liquid etchant 215.

Figure 2C:
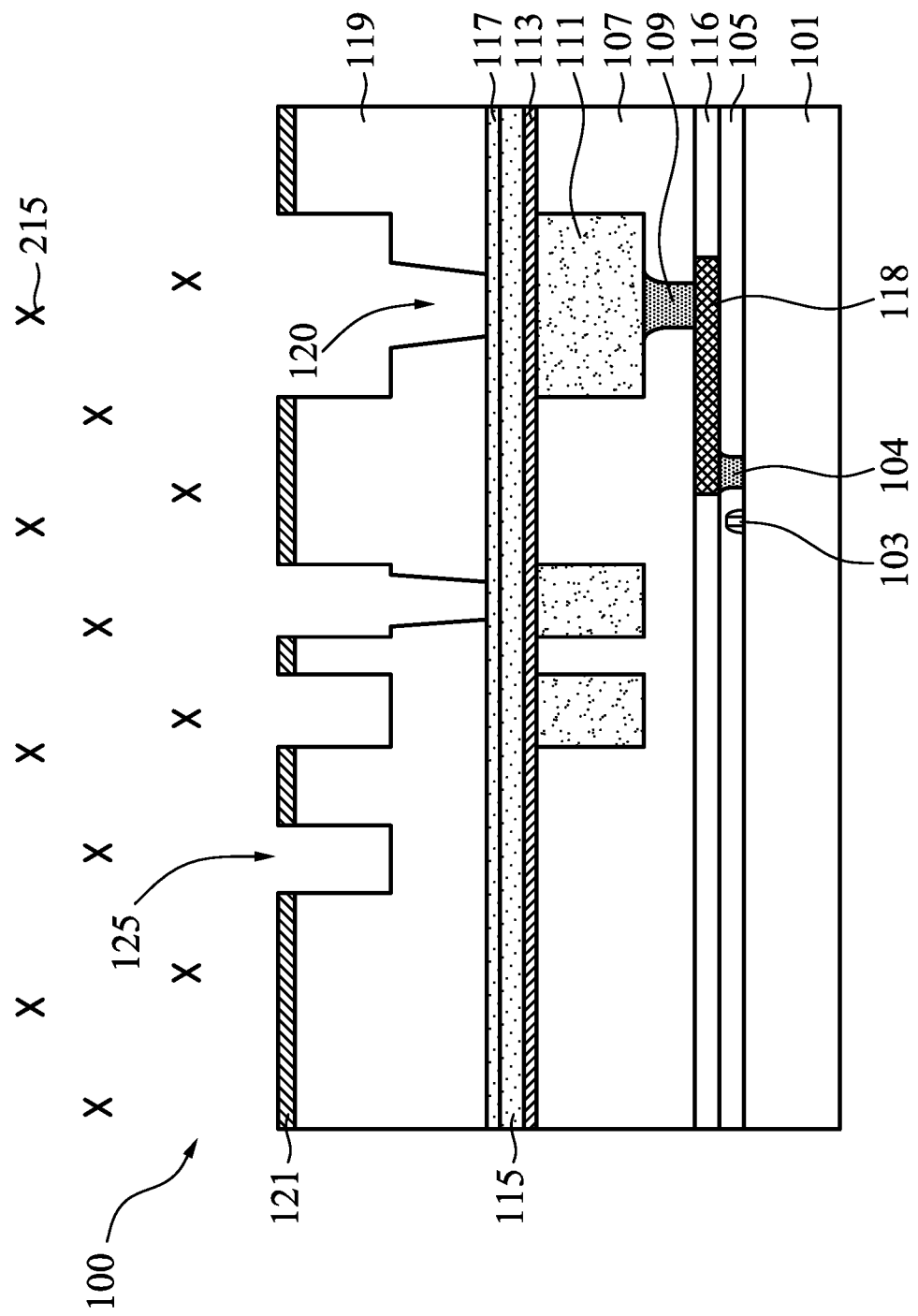

FIG. 2C illustrates that the surface of the semiconductor device 100 during the dispensing of the first liquid etchant (represented in FIG. 2C by the "X"s labeled 215). As illustrated, because the first liquid etchant 215 is an etchant selective to the material of the first hardmask 123, the dispersal of the first liquid etchant 215 will selectively remove the material of the first hardmask 123 without significantly removing other material that has been exposed.

Returning now to FIG. 2B, as the first liquid etchant 215 is being dispensed, the rotation of the semiconductor device 100 will work to remove used first liquid etchant 215 from the surface of the semiconductor device 100 (so that newly dispensed first liquid etchant 215 may take its place). As such, first discarded liquid 217 will slide off of the surface of the semiconductor device 100 in a direction parallel with a plane of rotation. However, as the first discarded liquid 217 is removed from the semiconductor device 100, the location of the first tier 209 will reclaim and catch the first discarded liquid 217. Once the first tier 209 has caught the first discarded liquid 217, the first discarded liquid 217 may be routed to a recycle unit (to be prepared for another dispersal through the first liquid dispenser 203) or else to be prepared for waste disposal.

Figure 3:
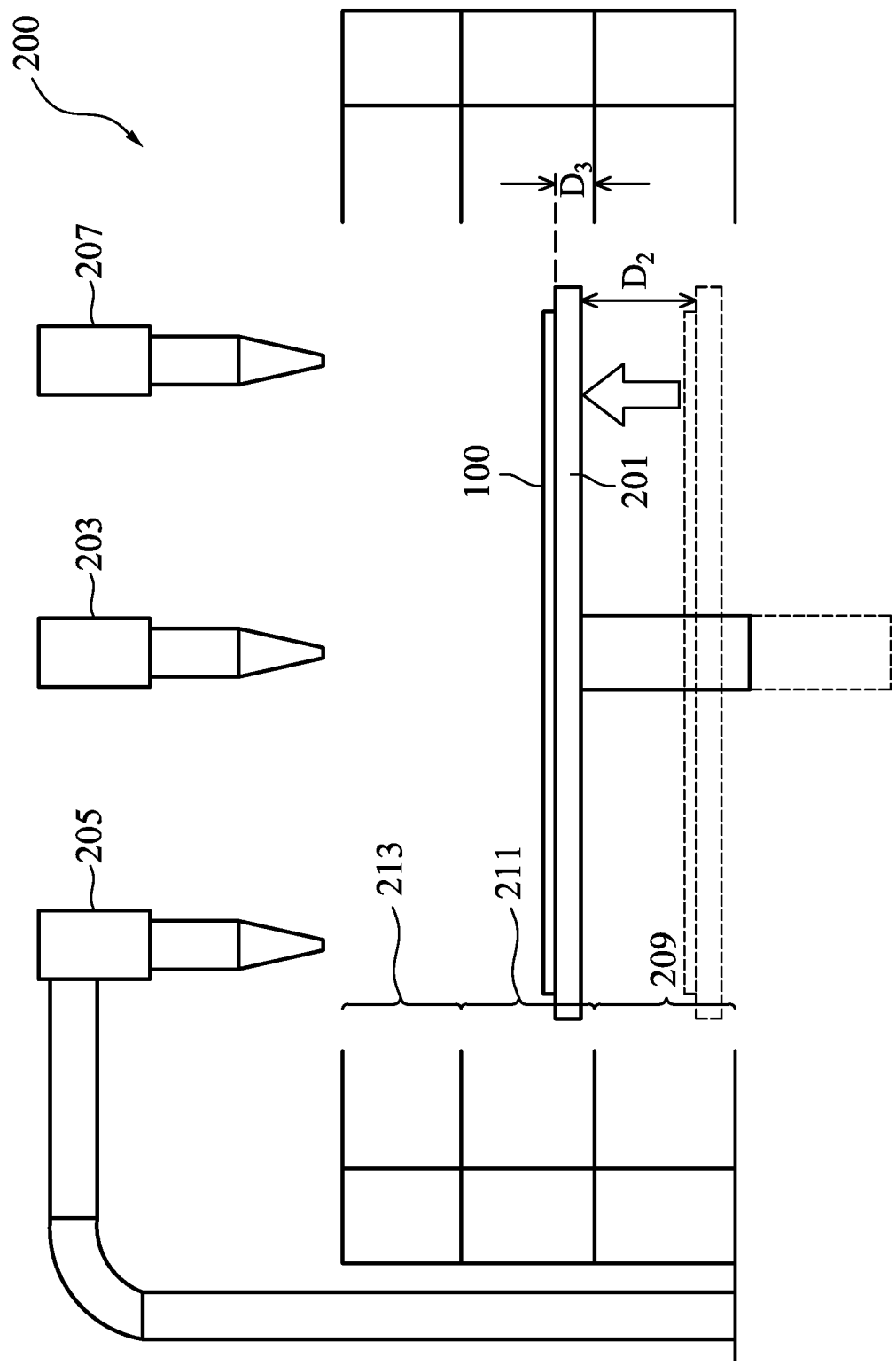
FIG. 3 illustrates a first movement of a semiconductor device, in accordance with some embodiments.

FIG. 3 illustrates that, after the first hardmask 123 has been removed in the first removal process, the first liquid dispenser 203 will stop dispensing the first liquid etchant 215 and the mounting platform 201 can adjust the position of the semiconductor device 100 to a second position in preparation for a dispensation of the first rinse liquid 401. In an embodiment the mounting platform 201 will move the semiconductor device 100 upwards a second distance $D_2$ of between about 30 mm and about 40 mm, such as about 30 mm. As such, the top surface of the mounting platform 201 may be located a third distance $D_3$ away from a bottom surface of the second tier 211, such as between about less 10 mm and about 15 mm, such as about 12 mm. However, any suitable distances may be utilized.

Additionally, prior to actually beginning the movement of the mounting platform 201, the spin speed of the mounting platform 201 and, hence, the spin speed of the semiconductor device 100, is lowered so that the spin speed of the semiconductor device 100 during movement will not cause undesired remnants of the first liquid etchant 215 from contaminating the second tier 211. As such, the spin speed of the mounting platform 201 can be reduced to be between about 0 rpm and about 100 rpm, such as less than 1 rpm. However, any suitable spin speed which will reduce or prevent contamination of the second tier 211 may be utilized.

Before, after or during the movement of the mounting platform 201 and the semiconductor device 100, the liquid dispensers may also move in preparation for a dispensing of the first rinse liquid 401. In an embodiment the first liquid dispenser 203 will rotate or otherwise move so that the first liquid dispenser 203 does not interfere with the dispensation of the first rinse liquid 401. In addition, the second liquid dispenser 205 will rotate or otherwise move so that the second liquid dispenser 205 is positioned over the location of the semiconductor device 100 such that the first rinse liquid 401 is dispensed from a position directly over the semiconductor device 100. However, any suitable position of the second liquid dispenser 205 to dispense the first rinse liquid 401 may be utilized.

Figure 4:
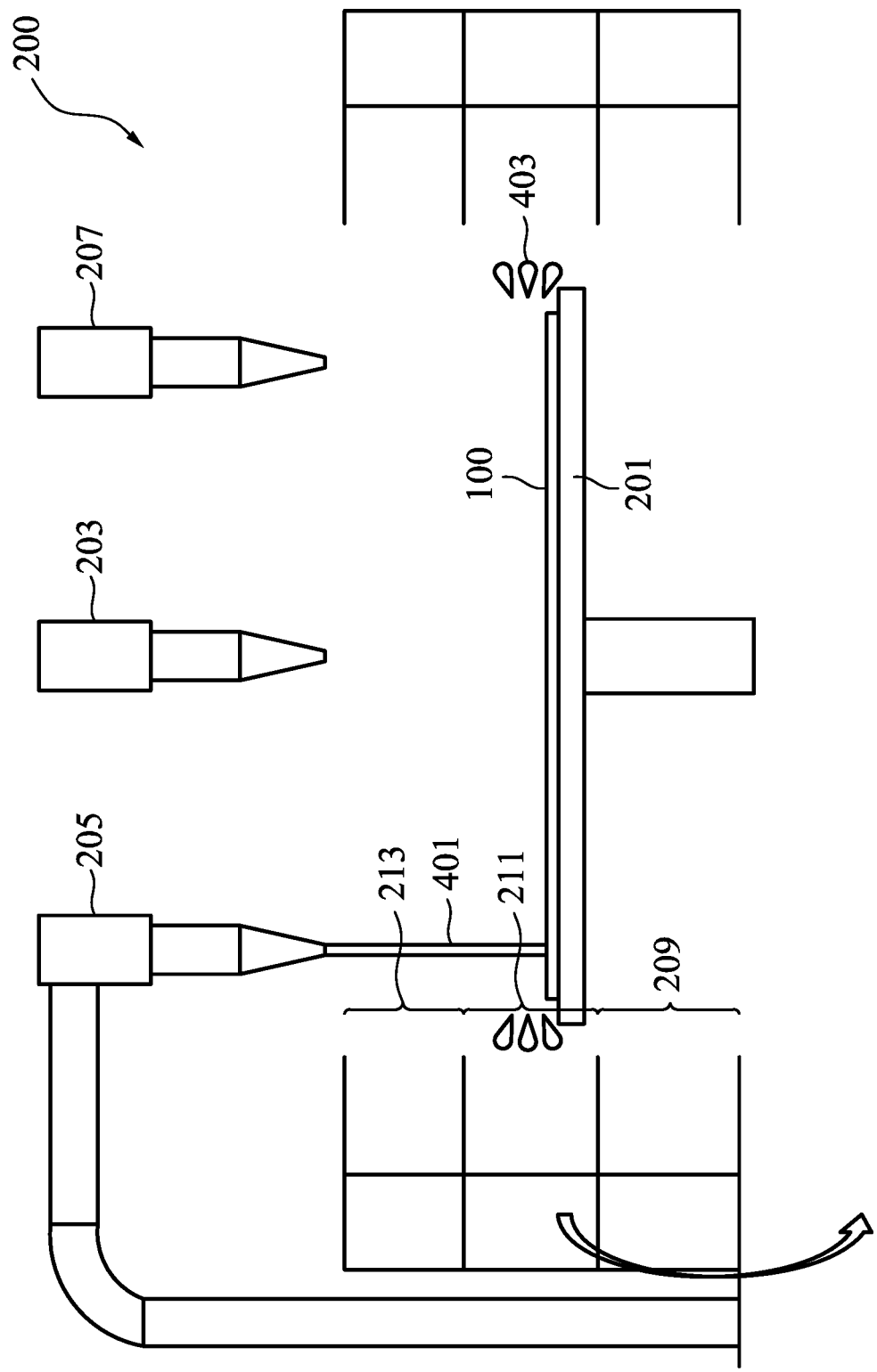
FIG. 4 illustrates a second dispersal process, in accordance with some embodiments.

FIG. 4 illustrates a dispensing of the first rinse liquid 401 from the second liquid dispenser 205 and onto the semiconductor device 100 during a second dispensing process. In an embodiment the second dispensing process may be initiated (after the mounting platform 201 has finished moving the semiconductor device 100) by the mounting platform 201 increasing the spin speed of the semiconductor device 100 to a second dispersal rotation speed between about 300 rpm and about 2000 rpm, such as about 1500 rpm. However, any suitable spin speed may be utilized.

Once the semiconductor device 100 is rotating at the desired speed, the second liquid dispenser 205 may begin the second dispensing process by dispensing the first rinse liquid 401. In an embodiment the first rinse liquid 401 may be a liquid chosen to rinse off the semiconductor device 100 and remove any remaining remnants of the first liquid etchant 215 so that these remnants are not present to interfere in later fabrication steps. As such, the first rinse liquid 401 may be a liquid such as deionized water, isopropanol, or an ammonia doping in water. However, any suitable rinse liquid may be utilized.

In an embodiment the first rinse liquid 401 may be dispensed from the second liquid dispenser 205 at a rate of between about 1000 mL/min and about 1200 mL/min. Additionally, the first rinse liquid 401 may be dispensed at a temperature of between about 23° C. and about 25° C., such as about 25° C., and may be dispensed for a time of between about 5 s and about 50 s, such as about 45 s. However, any suitable process conditions may be utilized during the dispensing of the first rinse liquid 401.

As the first rinse liquid 401 is being dispensed, the rotation of the semiconductor device 100 will work to remove used first rinse liquid 401 from the surface of the semiconductor device 100 (so that newly dispensed first rinse liquid 401 may take its place). As such, second discarded liquid 403 will slide off of the surface of the semiconductor device 100 in a direction parallel with a plane of rotation. However, as the second discarded liquid 403 is removed from the semiconductor device 100, the second tier 211 will catch the second discarded liquid 403. Once the second tier 211 has caught the second discarded liquid 403, the second discarded liquid 403 may be routed to a recycle unit (to be prepared for another dispersal through the second liquid dispenser 205) or else to be prepared for waste disposal.

In addition to the second liquid dispenser 205 dispensing the first rinse liquid 401 to rinse off the semiconductor device 100 between process steps, the second liquid dispenser 205 may also be used to makeup portions of the first discarded liquid 217 that has been lost to nature. In some embodiments, before the mounting platform 201 has moved, the second liquid dispenser 205 may be moved into position and dispense between about 1 cc and about 10 cc of first rinse liquid 401 (e.g., deionized water) which will be reclaimed and captured by the first tier 209 to be mixed with the first discarded liquid 217 and make up portions of the first discarded liquid 217. Further, this optional process may be repeated for each of the process liquids.

Figure 5:
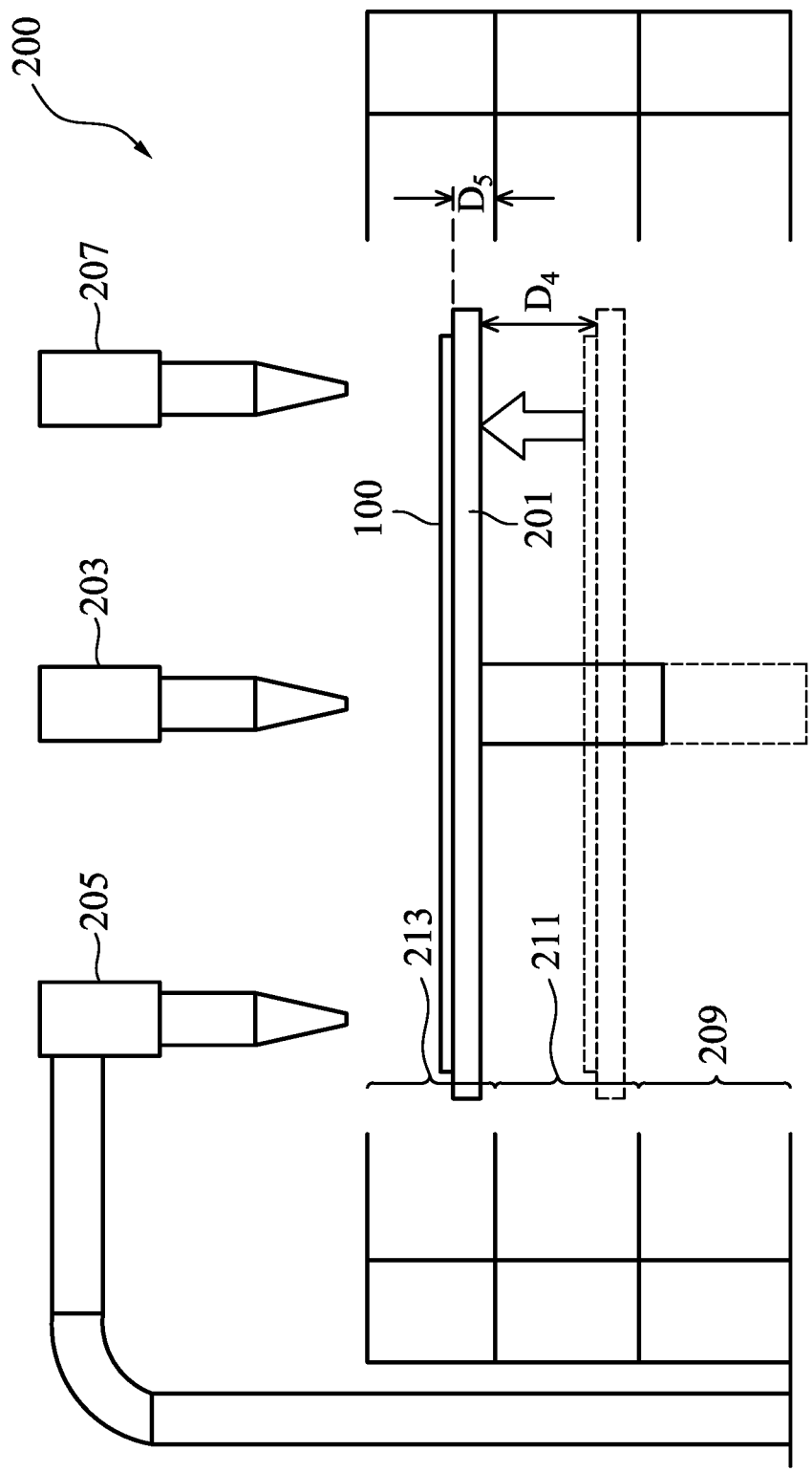
FIG. 5 illustrates a second movement of the semiconductor device, in accordance with some embodiments.

FIG. 5 illustrates that, after the semiconductor device 100 has been rinsed using the first rinsing liquid 401, the second liquid dispenser 205 will stop dispensing the first rinse liquid 401 and the mounting platform 201 can adjust the position of the semiconductor device 100 to a third position in preparation for a dispensation of the second liquid etchant 601. In an embodiment the mounting platform 201 will move the semiconductor device 100 upwards a fourth distance $D_4$ of between about 30 mm and about 40 mm, such as about 30 mm. As such, the top surface of the mounting platform 201 may be located a fifth distance $D_5$ away from a bottom surface of the third tier 213, such as between about less 10 mm and about 15 mm, such as about 12 mm. However, any suitable distances may be utilized.

However, prior to actually beginning the movement of the mounting platform 201, the spin speed of the mounting platform 201 and, hence, the spin speed of the semiconductor device 100, is lowered so that the speed will not cause undesired remnants of the first rinse liquid 401 from contaminating the third tier 213. As such, the spin speed of the mounting platform 201 can be reduced to be between about 0 rpm and about 50 rpm, such as less than 1 rpm. However, any suitable spin speed which will reduce or prevent contamination of the third tier 213 may be utilized.

Before, after or during the movement of the mounting platform 201 and the semiconductor device 100, the liquid dispensers may also move in preparation for a dispensing of the second liquid etchant 601. In an embodiment the second liquid dispenser 205 will rotate or otherwise move so that the second liquid dispenser 205 does not interfere with the dispensation of the second liquid etchant 601. In addition, the third liquid dispenser 207 will rotate or otherwise move so that the third liquid dispenser 207 is positioned over the location of the semiconductor device 100 such that the second liquid etchant 601 is dispensed from a position directly over the semiconductor device 100. However, any suitable position of the third liquid dispenser 207 to dispense the second liquid etchant 601 may be utilized.

Figure 6A:
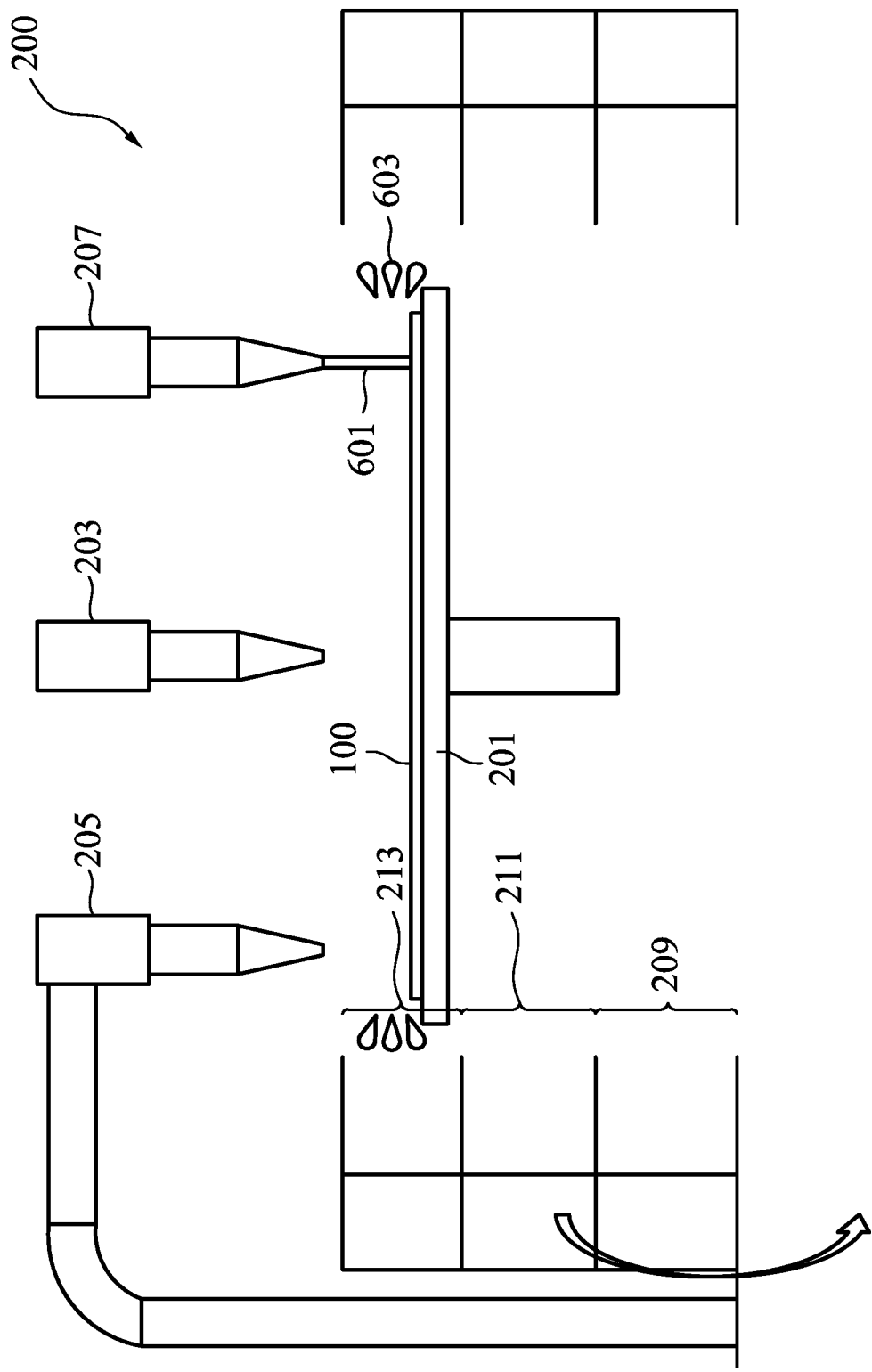
FIGS. 6A-6B illustrate a third dispersal process, in accordance with some embodiments.

FIG. 6A illustrates a dispensing of the second liquid etchant 601 from the third liquid dispenser 207 and onto the semiconductor device 100 during a third dispensing process. In an embodiment the third dispensing process may be initiated (after the mounting platform 201 has finished moving the semiconductor device 100) by the mounting platform 201 increasing the spin speed of the semiconductor device 100 to a third dispersal rotation speed of between about 100 rpm and about 2000 rpm, such as about 1000 rpm. However, any suitable spin speed may be utilized.

Once the semiconductor device 100 is rotating at the third dispersal rotation speed, the third liquid dispenser 207 may begin the third dispensing process by dispensing the second liquid etchant 601 onto the semiconductor device 100. In an embodiment the second liquid etchant 601 is an etchant that is selective to the materials of one or more of the etch stop layers exposed by the via opening 120 (e.g., the first etch stop layer 113, the second etch stop layer 115, and the third etch stop layer 117). In such an embodiment the second liquid etchant 601 may comprise both a second etching solvent and a second etching agent.

The second etching agent may be an agent which helps to selectively remove the materials of one or more of the etch stop layers (e.g., the first etch stop layer 113, the second etch stop layer 115, and the third etch stop layer 117). As such, while the precise agent depends at least in part on the materials chosen for the first etch stop layer 113, the second etch stop layer 115, and the third etch stop layer 117, in an embodiment the second etching agent may be a fluoride agent such as ammonium fluoride or the like.

The second etching solvent may be utilized to help mix and deliver the second etching agent without necessarily participating in the etching reaction itself. In a particular embodiment the second etching solvent may be a solvent such as deionized water, an ammonia doping in water or the like. However, any suitable solvent may be utilized.

To prepare the second liquid etchant 601 for usage, the second etching agent may be placed within the second etching solvent. In an embodiment the second etching agent may be placed within the second etching solvent to have a concentration of between about 0.01% and about 0.5%, such about 0.01%. However, any suitable concentration may be utilized.

In an embodiment the second liquid etchant 601 may be dispensed from the third liquid dispenser 207 at a rate of between about 120 mL/min and about 150 mL/min. Additionally, the second liquid etchant 601 may be dispensed at a temperature of between about 50° C. and about 60° C., such as about 55° C., and may be dispensed for a time of between about 10 s and about 30 s, such as about 18 s. However, any suitable process conditions may be utilized during the dispensing of the second liquid etchant 601.

Figure 6B:
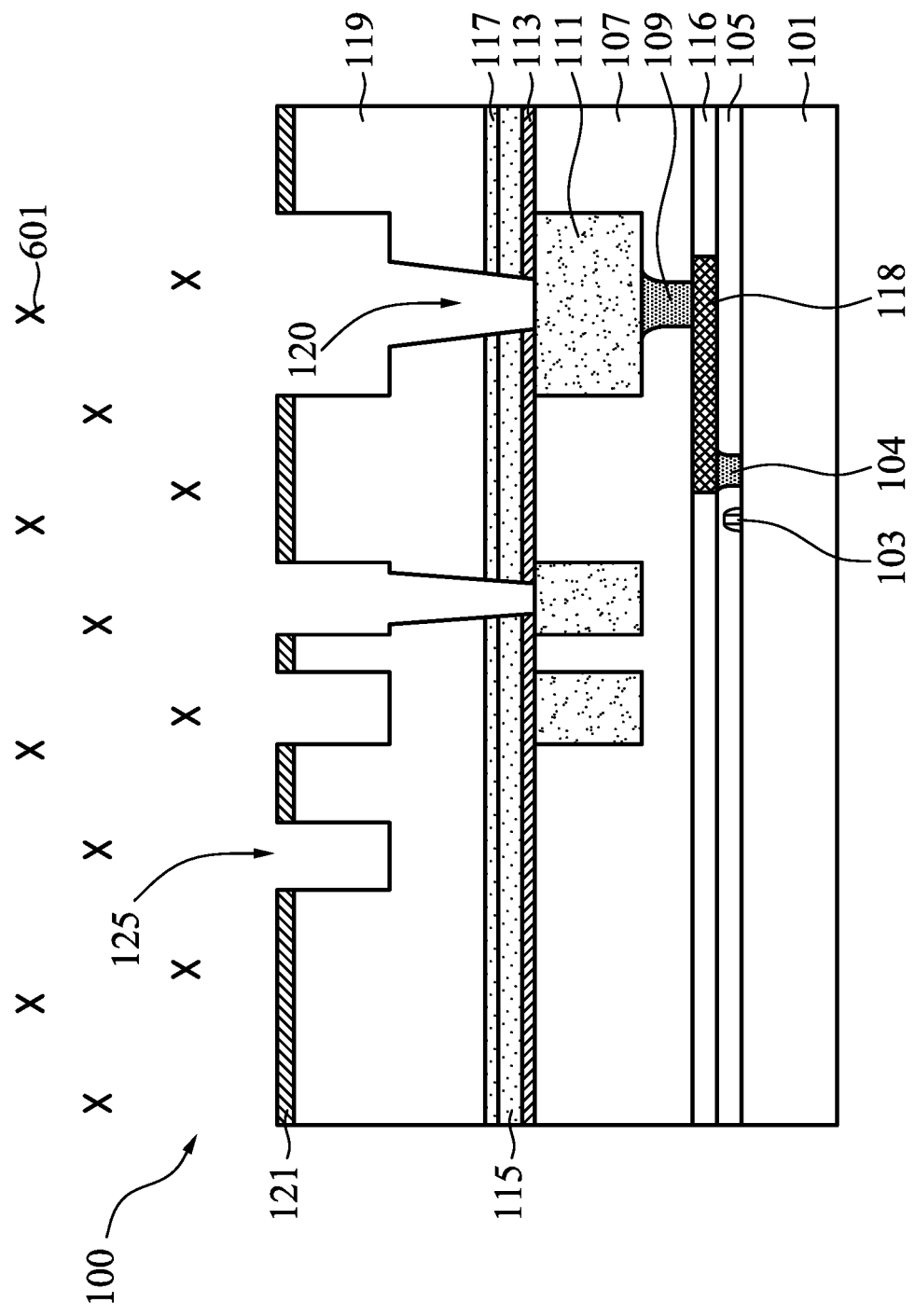

FIG. 6B illustrates the surface of the semiconductor device 100 during the dispensing of the second liquid etchant (represented in FIG. 6B by the "X"s labeled 601). As illustrated, because the second liquid etchant 601 is an etchant selective to the material of the etch stop layers (e.g., the first etch stop layer 113, the second etch stop layer 115, and the third etch stop layer 117), the dispersal of the second liquid etchant 601 will selectively remove one or more of the materials of the etch stop layers (e.g., the first etch stop layer 113, the second etch stop layer 115, and the third etch stop layer 117) without significantly removing other material that has been exposed.

By removing the hard mask layer 123 and breaking through the etch stop layers (e.g., the first etch stop layer 113, the second etch stop layer 115, and the third etch stop layer 117) with different chemicals, a larger selectivity may be achieved. As such, the sidewalls of the openings through the etch stop layers may be formed smoother than otherwise, and, with more control, there can be a smaller distance that can be achieved between adjacent openings. However, by making each process occur within the same process chamber, these benefits can be achieved without overly increasing the time of processing.

Returning now to FIG. 6A, as the second liquid etchant 601 is being dispensed, the rotation of the semiconductor device 100 will work to remove used second liquid etchant 601 from the surface of the semiconductor device 100 (so that newly dispensed second liquid etchant 601 may take its place). As such, third discarded liquid 603 will slide off of the surface of the semiconductor device 100 in a direction parallel with a plane of rotation. However, as the third discarded liquid 603 is removed from the semiconductor device 100, the location of the third tier 213 will catch the third discarded liquid 603. Once the third tier 213 has caught the third discarded liquid 603, the third discarded liquid 603 may be routed to a recycle unit (to be prepared for another dispersal through the third liquid dispenser 207) or else to be prepared for waste disposal.

Figure 7:
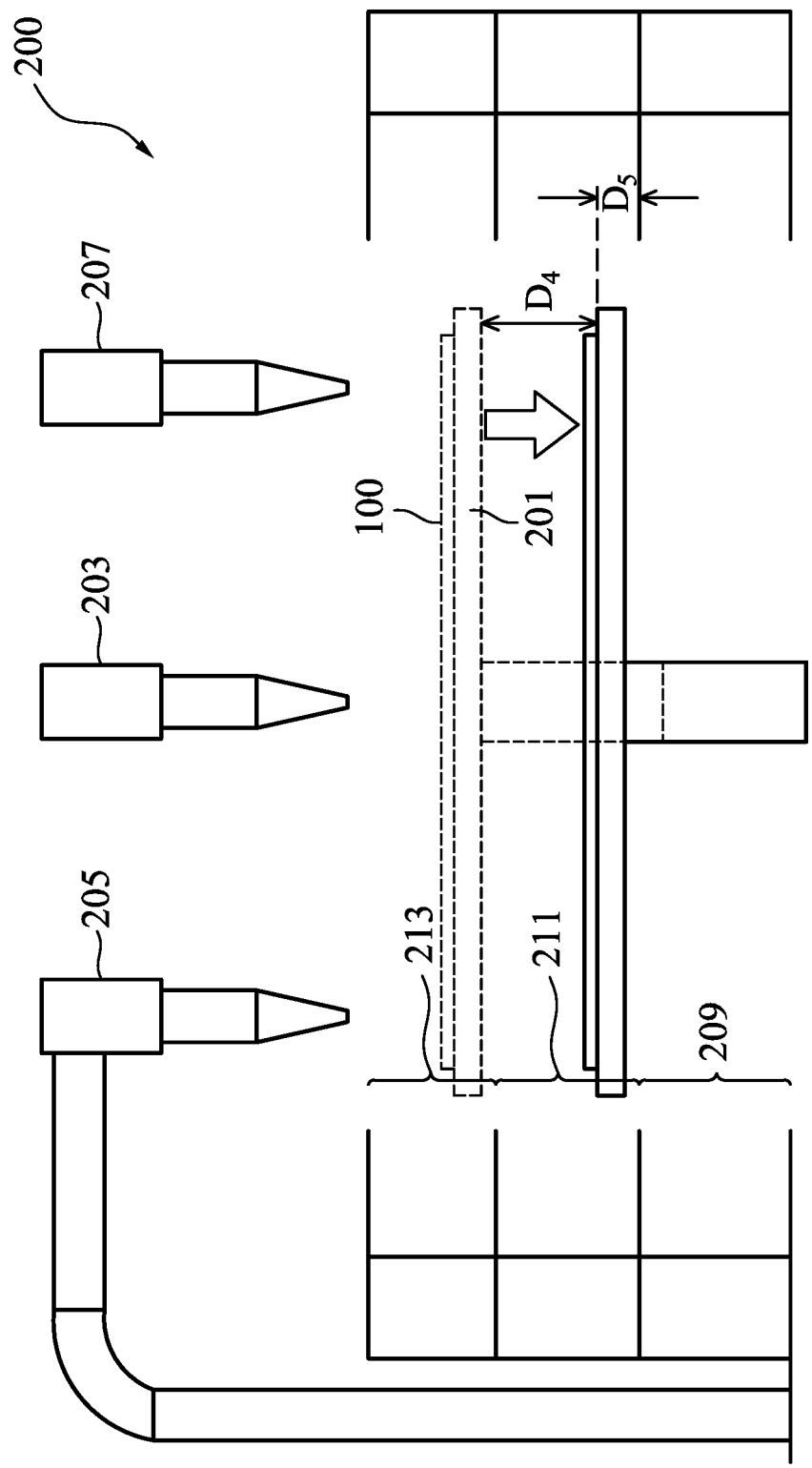
FIG. 7 illustrates a third movement of the semiconductor device, in accordance with some embodiments.

FIG. 7 illustrates that, after the semiconductor device 100 has been etched using the second liquid etchant 601, the third liquid dispenser 207 will stop dispensing the second liquid etchant 601 and the mounting platform 201 can adjust the position of the semiconductor device 100 back to the second position (e.g., adjacent to the second tier 211) in preparation for a dispensation of a second rinse liquid 801. In particular, the mounting platform 201 will move back down the fourth distance $D_4$ so that the top surface of the mounting platform 201 is located the fifth distance $D_5$ from the bottom surface of the second tier 211. However, any suitable distance may be utilized.

However, prior to actually beginning the movement of the mounting platform 201, the spin speed of the mounting platform 201 and, hence, the spin speed of the semiconductor device 100, is lowered so that the speed will not cause undesired remnants of the second liquid etchant 601 from contaminating the second tier 211. As such, the spin speed of the mounting platform 201 can be reduced to be between about 0 rpm and about 50 rpm, such as less than 1 rpm. However, any suitable spin speed which will reduce or prevent contamination of the second tier 211 may be utilized.

Before, after or during the movement of the mounting platform 201 and the semiconductor device 100, the liquid dispensers may also move in preparation for a dispensing of the second rinse liquid 801. In an embodiment the third liquid dispenser 207 will rotate or otherwise move so that the third liquid dispenser 207 does not interfere with the dispensation of the second rinse liquid 801. In addition, the second liquid dispenser 205 will rotate or otherwise move so that the second liquid dispenser 205 is positioned over the location of the semiconductor device 100 such that the second rinse liquid 801 is dispensed from a position directly over the semiconductor device 100. However, any suitable position of the second liquid dispenser 205 to dispense the second rinse liquid 801 may be utilized.

Figure 8:
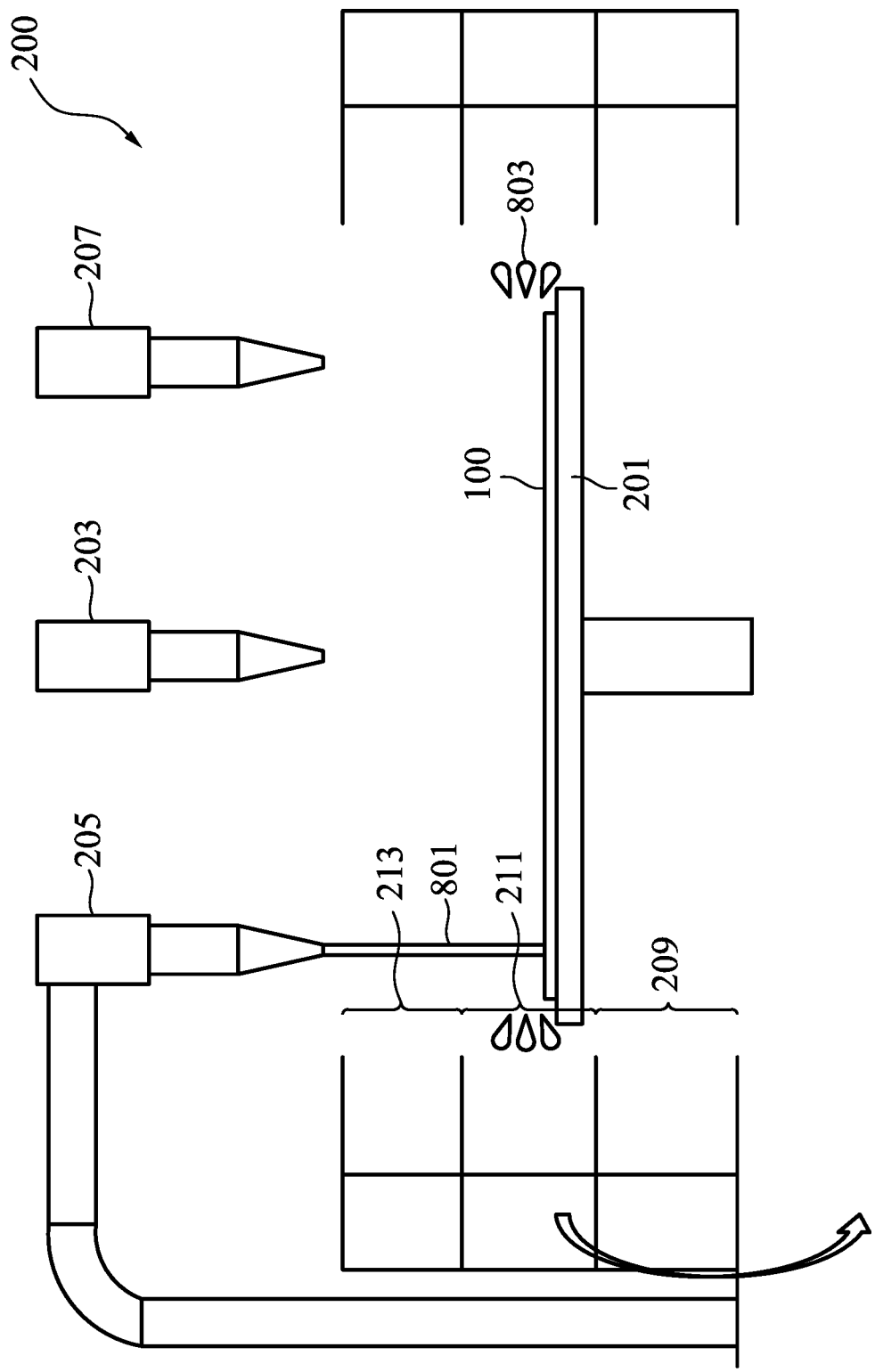
FIG. 8 illustrates a fourth dispersal process, in accordance with some embodiments.

FIG. 8 illustrates a start of an optional fourth dispensing process that may be utilized to remove any remnants of the second liquid etchant 601 that may still remain on the semiconductor device 100 after the third dispensing process. In an embodiment the fourth dispensing process may be initiated (after the mounting platform 201 has finished moving the semiconductor device 100) by the mounting platform 201 increasing the spin speed of the semiconductor device 100 to a fourth dispersal rotation speed between about 800 rpm and about 2000 rpm, such as about 1000 rpm. However, any suitable spin speed may be utilized.

Once the semiconductor device 100 is rotating at the desired speed, the second liquid dispenser 205 may begin the fourth dispensing process by dispensing the second rinse liquid 801. In an embodiment the second rinse liquid 801 may be a liquid chosen to rinse off the semiconductor device 100 and remove any remaining remnants of the second liquid etchant 601 so that these remnants are not present to interfere in later fabrication steps. As such, the second rinse liquid 801 may be similar to the first rinse liquid 401, such as by being a liquid such as deionized water. However, any suitable rinse liquid may be utilized.

Additionally, in some embodiments the second rinse liquid 801 is chosen to not only help to physically remove the second liquid etchant 601 from the semiconductor device 100, but to also release any electrical charges that have built up during the previous manufacturing steps and which may interfere in subsequent manufacturing processes. In such an embodiment the second rinse liquid 801 may be an alkaline liquid, such as an alkaline water, which may be weakly alkaline, such as by having a pH of between about 7.5 and about 10. However, any suitable pH may be utilized.

In an embodiment the second rinse liquid 801 may be dispensed from the second liquid dispenser 205 (or, if desired, another, unillustrated liquid dispenser) at a rate of between about 1000 mL/min and about 1500 mL/min. Additionally, the second rinse liquid 801 may be dispensed at a temperature of greater than about 55° C. to about 60° C. and may be dispensed for a time of between about 15 s and about 240 s, such as about 120 s. However, any suitable process conditions may be utilized during the dispensing of the second rinse liquid 801.

As the second rinse liquid 801 is being dispensed, the rotation of the semiconductor device 100 will work to remove used second rinse liquid 801 from the surface of the semiconductor device 100 (so that newly dispensed second rinse liquid 801 may take its place). As such, fourth discarded liquid 803 will slide off of the surface of the semiconductor device 100 in a direction parallel with a plane of rotation. However, as the fourth discarded liquid 803 is removed from the semiconductor device 100, the second tier 211 will catch the fourth discarded liquid 803. Once the second tier 211 has caught the fourth discarded liquid 803, the fourth discarded liquid 803 may be routed to a recycle unit (to be prepared for another dispersal through the second liquid dispenser 205) or else to be prepared for waste disposal.

Additionally, while a very specific set of processes in a particular order (e.g., the first dispensing process followed by the second dispensing process followed by the third dispensing process) is described above, this is intended to be illustrative to the embodiments and is not intended to be limiting. Rather, any suitable combination of dispensing processes may be utilized. For example, the first dispensing process may be utilized along with the third dispensing process without the use of an intervening second dispensing process; the second dispensing process may be used with the third dispensing process without using the first dispensing process; or the third dispensing process may be used by itself without the first dispensing process or the second dispensing process.

In yet other examples, some of the dispensing processes may be repeated. For example, in one embodiment a process may begin with the second dispensing process which is then followed by the third dispensing process, the first dispensing process, and then the third dispensing process may be repeated. In another embodiment the first dispensing process may be followed by the third dispensing process, the second dispensing process, and then a repeat of the third dispensing process. These combinations and any other suitable combination of the dispensing processes may be utilized, and all such combinations are fully intended to be included within the scope of the embodiments.

Figure 9:
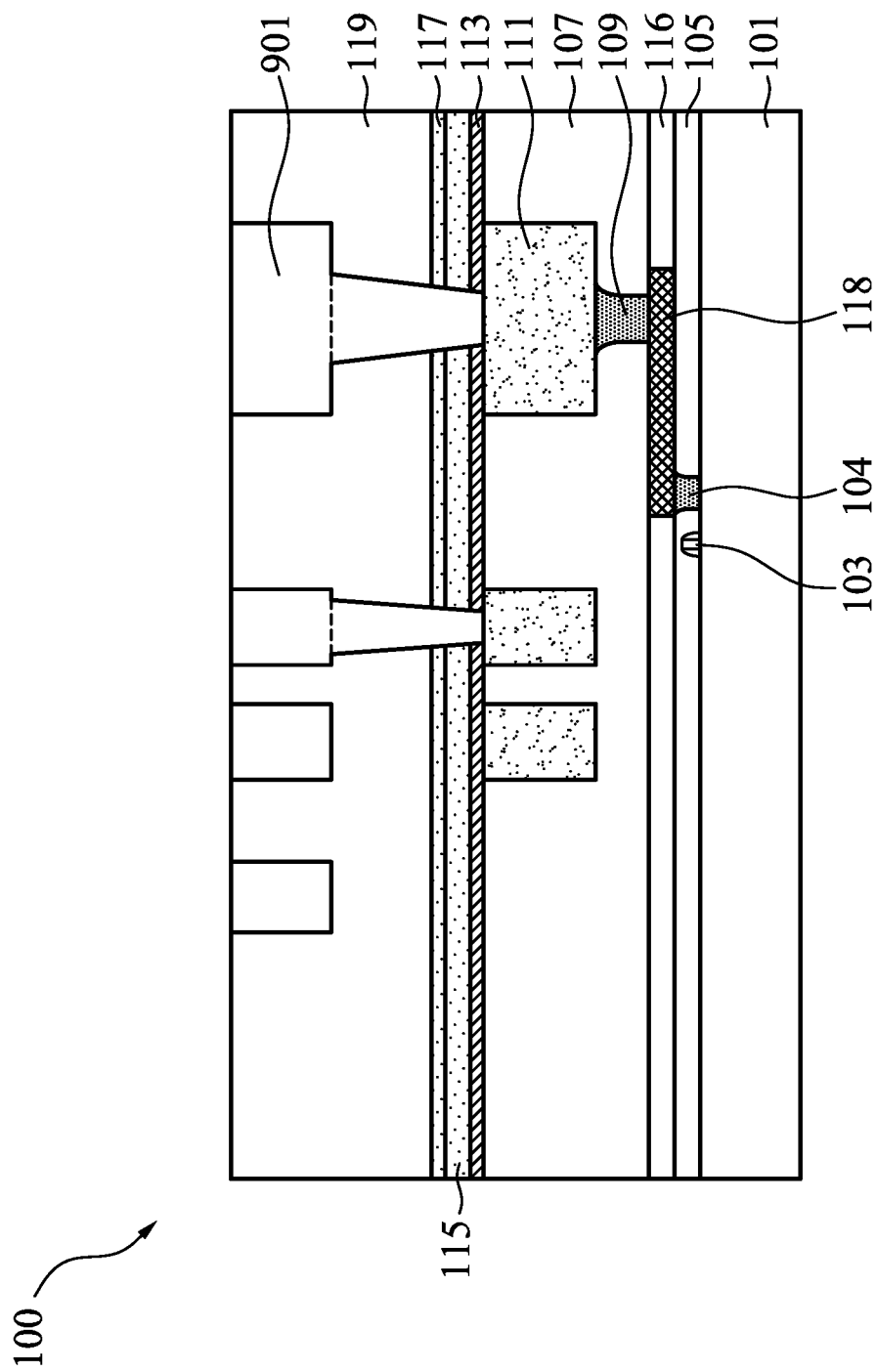
FIG. 9 illustrates a formation of an interconnect, in accordance with some embodiments.

FIG. 9 illustrates that, once the first hardmask 123 and the one or more of the etch stop layers have been removed, the interconnect 901 may be formed. In an embodiment the interconnect 901 may comprise a first barrier layer in order to help isolate and protect a subsequently formed conductive material (discussed further below). In an embodiment the first barrier layer may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer may be formed to have a thickness of between about 0.1 µm and about 20 µm, such as about 0.5 µm.

Once the first barrier layer has been formed, a remainder of the openings are filled with a conductive material to form the interconnect 901 with a via portion (within the via openings 120) and the trench portion (within the trench opening 125, and illustrated as being separated from the via portion using a dashed line, although there may or may not be a physical indication of the separation). The conductive material may comprise copper, although other suitable materials such as aluminum, alloys, doped polysilicon, combinations thereof, and the like, may alternatively be utilized. The conductive material may be formed by depositing a seed layer (not separately illustrated), electroplating copper onto the seed layer, and filling and overfilling the trench openings 125 and the via opening 120. Once the trench openings 125 and the via opening 120 have been filled, excess portions of the first barrier layer, the seed layer, and conductive material outside of the trench openings 125 and the via opening 120 may be removed through a planarization process such as chemical mechanical polishing (CMP), although any suitable removal process may be used.

By utilizing the apparatus and processes described herein, both the first hardmask 123 and one or more of the etch stop layers (e.g., the first etch stop layer 113, the second etch stop layer 115, and/or the third etch stop layer 117) may be removed in-situ and within a single apparatus or chamber. As such, the longer process times and risks of transfer pass particle contamination usually associated with multistep processes may be avoided. Additionally, by reducing the spin speed of the mounting platform 201 between dispensing processes and as the mounting platform 201 is moving, cross contamination between the tiers and, thus, between the recycle loops, may be reduced or eliminated. As such, the overall process throughput may be increased.

In accordance with an embodiment, a method of manufacturing a semiconductor device, the method includes: depositing an etch stop layer over a semiconductor substrate; depositing a dielectric layer over the etch stop layer; depositing a hard mask layer over the etch stop layer; using the hard mask layer to pattern the dielectric layer and expose the etch stop layer; applying a first etchant to remove the hard mask layer; and applying a second etchant to remove a portion of the etch stop layer, wherein the applying the first etchant and the applying the second etchant are performed in a same etching chamber. In an embodiment, the etch stop layer comprises aluminum oxide and the hard mask layer comprises titanium nitride. In an embodiment, the first etchant comprises hydrogen peroxide. In an embodiment, the first etchant is applied at a temperature of greater than 55° C. In an embodiment, the hydrogen peroxide is at a concentration of between about 10% and about 50%. In an embodiment, the second etchant comprises a fluoride. In an embodiment, the fluoride is at a concentration of between about 0.01% and about 0.5%.

In accordance with another embodiment, a method of manufacturing a semiconductor device, the method includes: placing a semiconductor substrate on a mounting platform at a first position with a first height; dispensing a first etchant over the mounting platform to remove at least a portion of a hard mask layer over the semiconductor substrate; moving the mounting platform to a second position with a second height different from the first height; and dispensing a second etchant over the mounting platform to remove at least a portion of an etch stop layer over the semiconductor substrate, the etch stop layer being separated from the hard mask layer by a dielectric layer. In an embodiment, a first tier is located adjacent to the mounting platform at the first height and a second tier is located adjacent to the mounting platform at the second height. In an embodiment, discarded first etchant is captured by the first tier during the dispensing the first etchant and wherein discarded second etchant is captured by the second tier during the dispensing the second etchant. In an embodiment, the dispensing the first etchant is performed at a first spin speed and the moving the mounting platform is performed at a second spin speed less than the first spin speed. In an embodiment, the second spin speed is less than about 1 rpm. In an embodiment, the method further includes rinsing the semiconductor substrate between the dispensing the first etchant and the dispensing the second etchant. In an embodiment, the rinsing the semiconductor substrate is performed at a third height different from the first height and the second height.

In accordance with yet another embodiment, a method of manufacturing a semiconductor device, the method includes: dispensing a first etchant over a semiconductor substrate to etch one of a hard mask layer or an etch stop layer over the semiconductor substrate, the dispensing the first etchant occurring in a first etching chamber while the semiconductor substrate is rotating at a first speed; reducing the first speed to a second speed; adjusting a height of the semiconductor substrate within the first etching chamber while the semiconductor substrate is rotating at the second speed; increasing the second speed to a third speed; and dispensing a second etchant over the semiconductor substrate within the etching chamber to etch the other one of the hard mask layer or the etch stop layer, the dispensing the second etchant occurring while the semiconductor substrate is rotating at the third speed. In accordance with an embodiment, the second speed is less than about 1 rpm. In accordance with an embodiment, the method further comprises rinsing the semiconductor substrate between the dispensing the first etchant and the dispensing the second etchant. In accordance with an embodiment, the method further includes rinsing the semiconductor substrate after the dispensing the second etchant. In accordance with an embodiment, the rinsing the semiconductor substrate comprises dispensing a rinse liquid, the rinse liquid being alkaline. In accordance with an embodiment, a first tier catches discarded first etchant during the dispensing the first etchant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing an etch stop layer over a semiconductor substrate;
   depositing a dielectric layer over the etch stop layer;
   depositing a hard mask layer over the etch stop layer;
   using the hard mask layer to pattern the dielectric layer and expose the etch stop layer;
   applying a first etchant to remove the hard mask layer; and
   applying a second etchant to remove a portion of the etch stop layer, wherein the applying the first etchant and the applying the second etchant are performed in a same etching chamber.

2. The method of claim 1, wherein the etch stop layer comprises aluminum oxide and the hard mask layer comprises titanium nitride.

3. The method of claim 2, wherein the first etchant comprises hydrogen peroxide.

4. The method of claim 3, wherein the first etchant is applied at a temperature of greater than 55° C.

5. The method of claim 4, wherein the hydrogen peroxide is at a concentration of between about 10% and about 50%.

6. The method of claim 4, wherein the second etchant comprises a fluoride.

7. The method of claim 6, wherein the fluoride is at a concentration of between about 0.01% and about 0.5%.

8. A method of manufacturing a semiconductor device, the method comprising:
   placing a semiconductor substrate on a mounting platform at a first position with a first height;
   dispensing a first etchant over the mounting platform to remove at least a portion of a hard mask layer over the semiconductor substrate;
   moving the mounting platform to a second position with a second height different from the first height; and
   dispensing a second etchant over the mounting platform to remove at least a portion of an etch stop layer over the semiconductor substrate, the etch stop layer being separated from the hard mask layer by a dielectric layer.

9. The method of claim 8, wherein a first tier is located adjacent to the mounting platform at the first height and a second tier is located adjacent to the mounting platform at the second height.

10. The method of claim 9, wherein discarded first etchant is captured by the first tier during the dispensing the first etchant and wherein discarded second etchant is captured by the second tier during the dispensing the second etchant.

11. The method of claim 8, wherein the dispensing the first etchant is performed at a first spin speed and the moving the mounting platform is performed at a second spin speed less than the first spin speed.

12. The method of claim 11, wherein the second spin speed is less than about 1 rpm.

13. The method of claim 8, further comprising rinsing the semiconductor substrate between the dispensing the first etchant and the dispensing the second etchant.

14. The method of claim 13, wherein the rinsing the semiconductor substrate is performed at a third height different from the first height and the second height.

15. A method of manufacturing a semiconductor device, the method comprising:
    dispensing a first etchant over a semiconductor substrate to etch one of a hard mask layer or an etch stop layer over the semiconductor substrate, the dispensing the first etchant occurring in a first etching chamber while the semiconductor substrate is rotating at a first speed;
    reducing the first speed to a second speed;
    adjusting a height of the semiconductor substrate within the first etching chamber while the semiconductor substrate is rotating at the second speed;
    increasing the second speed to a third speed; and
    dispensing a second etchant over the semiconductor substrate within the first etching chamber to etch the other one of the hard mask layer or the etch stop layer, the dispensing the second etchant occurring while the semiconductor substrate is rotating at the third speed.

16. The method of claim 15, wherein the second speed is less than about 1 rpm.

17. The method of claim 15, further comprising rinsing the semiconductor substrate between the dispensing the first etchant and the dispensing the second etchant.

18. The method of claim 17, further comprising rinsing the semiconductor substrate after the dispensing the second etchant.

19. The method of claim 18, wherein the rinsing the semiconductor substrate comprises dispensing a rinse liquid, the rinse liquid being alkaline.

20. The method of claim 15, wherein a first tier catches discarded first etchant during the dispensing the first etchant.

* * * * *